(12) United States Patent
Sasaki et al.

(10) Patent No.: US 6,879,025 B2
(45) Date of Patent: Apr. 12, 2005

(54) SEMICONDUCTOR DEVICE INCORPORATING A DICING TECHNIQUE FOR WAFER SEPARATION AND A METHOD FOR MANUFACTURING THE SAME

(75) Inventors: Miki Sasaki, Kawasaki (JP); Toshifumi Minami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/008,958

(22) Filed: Dec. 5, 2001

(65) Prior Publication Data

US 2002/0043700 A1 Apr. 18, 2002

Related U.S. Application Data

(63) Continuation of application No. 09/135,740, filed on Aug. 18, 1998, now abandoned.

(30) Foreign Application Priority Data

Aug. 29, 1997 (JP) .............................................. 9-234875

(51) Int. Cl.[7] .......................................... H01L 23/544
(52) U.S. Cl. ........................ 257/620; 257/621; 257/48
(58) Field of Search ................ 257/620, 621, 257/48; 438/113, 458, 462

(56) References Cited

U.S. PATENT DOCUMENTS

| 5,414,297 | A |   | 5/1995 | Morita |
| 5,525,534 | A |   | 6/1996 | Ikemasu |
| 5,668,404 | A | * | 9/1997 | Abe et al. .................... 257/668 |
| 5,763,936 | A | * | 6/1998 | Yamaha et al. ............. 257/620 |
| 5,889,335 | A |   | 3/1999 | Kuroi |
| 5,946,230 | A |   | 8/1999 | Shimizu |
| 6,022,791 | A |   | 2/2000 | Cook |
| 6,043,554 | A |   | 3/2000 | Miwa |
| 6,084,287 | A | * | 7/2000 | Mitwalsky et al. ......... 257/620 |
| 6,153,941 | A |   | 11/2000 | Maejima |

FOREIGN PATENT DOCUMENTS

JP        04134855 A  *  5/1992  ........... H01L/27/04

* cited by examiner

Primary Examiner—Long Pham
Assistant Examiner—Nathan W. Ha
(74) Attorney, Agent, or Firm—Hogan & Hartson, LLP

(57) ABSTRACT

A semiconductor device includes a dicing region provided on a semiconductor substrate to separate a plurality of semiconductor chips each having a gate portion from each other. The semiconductor device further includes a plurality of element isolation regions provided on a surface portion of the semiconductor substrate within the dicing region, a plurality of first dummy patterns formed on a surface of the semiconductor substrate so as to correspond to intervals of the plurality of element isolation regions, respectively, and a plurality of second dummy patterns formed above the semiconductor substrate within the dicing region so as to correspond to the plurality of first dummy patterns, respectively.

12 Claims, 11 Drawing Sheets

SEMICONDUCTOR DEVICE INCORPORATING A DICING TECHNIQUE FOR WAFER SEPARATION AND A METHOD FOR MANUFACTURING THE SAME

This is a continuation of application Ser. No. 09/135,740 filed Aug. 18, 1998, now abandoned, which application is hereby incorporated by reference in its entirety.

BACKGROUND OF THE INVENTION

The present invention relates to a semiconductor device and a method for manufacturing the same and, more specifically, to a dicing (scribing) technique for separating or dividing a semiconductor wafer into chips (or pellets).

In the field of manufacture of semiconductor devices, CMP (Chemical Mechanical Polishing) has conventionally been known as a technique of flattening the surface of a film. The CMP has an advantage particularly in smoothening and flattening the surface of a film widely; however, it has the following problem. When an insulation film is formed in order to fill a recess portion and all the insulation film except that in a recess portion is removed by the CMP, the surface of the insulation film can be flattened in accordance with the depth of the recess portion if the width of the recess portion is small. If, however, the width of the recess portion is large (e.g., 1.5 µm or more), the insulation film in the recess portion is cut too much and a film reduction phenomenon called dishing occurs.

FIG. 1 illustrates a semiconductor memory device to explain a prior art countermeasure against the dishing.

The semiconductor memory device is usually obtained by dividing a semiconductor wafer 101 into a plurality of semiconductor chips 102 and separating the chips along a dicing line 103.

A TEG (Test Element Group) is generally provided on the dicing line 103. It is therefore unfavorable that the flatness of an insulation film be degraded by dishing even on the dicing line 103.

As one method for remedying the dishing on the dicing line 103, it can be thought that a laminated film 104 is formed on the major surface (within a so-called dicing region) of the semiconductor wafer 101, corresponding to the dicing line 103.

More specifically, in the semiconductor chip, a first insulation film (e.g., an $SiO_2$ film) 111 is buried in the major surface portion of the semiconductor wafer 101 corresponding to the dicing line 103, to form an element isolation region 112 having an STI (Shallow Trench Isolation) structure, and then a gate electrode portion 113 of a selective transistor serving as a word line is formed on the major surface of the wafer 101 corresponding to the semiconductor chip 102.

The gate electrode portion 113 is constituted as follows. A polysilicon film 115 having a thickness of about 1000 Å is formed on a gate oxide film 114 and a Wsi film (tungsten silicide film) 116 having a thickness of about 500 Å is formed on the polysilicon film 115 to produce a pattern. Moreover, a SiN film (silicon nitride film) 117 having a thickness of about 2000 Å is formed as a cap member on the Wsi film 116.

At the same time when the gate electrode portion 113 is formed, the laminated film 104 of the gate oxide film 114, polysilicon film 115, WSi film 116 and SiN film 117 is formed on the first insulation film 111.

A diffusion layer 118 serving as a source or a drain is formed on the major surface portion of the semiconductor wafer 101, which is adjacent to the gate electrode portion 113, and then a second insulation film (e.g., $SiO_2$ film) 119 is deposited on the entire surface of the resultant structure. The surface of the second insulation film 119 is flattened by CMP so as to have a thickness of approximately 5000 Å on the laminated film 104. An opening portion 120 communicating with the diffusion layer 118 is formed in the second insulation film 119.

After that, a W (tungsten) film having a thickness of about 2500 Å is deposited on the second insulation film 119 so as to fill the opening portion 120 and then patterned to form a bit line 121 and a diffusion layer contact portion 122 integrally with each other as one component.

A third insulation film (e.g., $SiO_2$ film) 123 is deposited on the whole surface of the resultant structure and then the surface of the film 123 is flattened by CMP using the top surface of the bit line 121 as a stopper.

A fourth insulation film (e.g., $SiO_2$ film) 124 is deposited on the entire surface of the third insulation film 123, and the surface of the film 124 is flattened by CMP so as to have a thickness of approximately 5000 Å. Then, an opening portion 125 communicating with the bit line 121 is formed in the fourth insulation film 124.

The opening portion 125 is filled with the W film to form a bit line contact portion 126 communicating with the bit line 121, and a fifth insulation film (e.g., $SiO_2$ film) 127 is deposited on the whole surface of the resultant structure. The surface of the fifth insulation film 127 is flattened by CMP so as to have a thickness of about 3000 Å on the bit line contact portion 126.

A wiring groove 128 communicating with the bit line contact portion 126 is formed in the fifth insulation film 127 and filled with an Al/Cu (aluminum/copper) film to form a wiring layer (first metal layer) 129 serving as a fuse layer.

A sixth insulation film (e.g., $SiO_2$ film) 130 having a thickness of 3000 Å or more is deposited on the entire surface of the resultant structure and its surface is flattened by CMP. Then, an opening portion 131 communicating with the wiring layer 129 is formed in the sixth insulation film 130.

Thereafter, a seventh insulation film (e.g., TEOS=Tetra Ethoxy Silane film) 132, an eighth insulation film (e.g., SiN film) 133, and a passivation film (e.g., PI film=polyimide film) 134 are deposited in order on the entire surface of the resultant structure. An opening portion 135 connecting with the opening portion 131, is formed in the passivation film 134, eighth insulation film 133, seventh insulation film 132 and sixth insulation film 130 by RIE (Reactive Ion Etching).

Simultaneously, parts of the passivation film 134, eighth insulation film 133, seventh insulation film 132 and sixth insulation film 130 are removed by RIE to form the dicing line 103.

In this case, the sixth insulation film 130 is etched, with a thickness of at least 3000 Å left, such that the total thickness of the insulation films 119, 123, 124, 127 and 130 on the laminated layer 104 is 18500 Å.

Part of each of the opening portions 131 and 135 is filled with the Al/Cu film to form a power supply wiring layer (second metal layer) 136 and concurrently a plurality of chips 102.

After that, the semiconductor wafer 101 is diced along the dicing line 103 and cut into the chips (pellets) 102 by a cut portion 137 and, in other words, a plurality of semiconductor memory device can be obtained at once.

In a semiconductor memory device so obtained, the laminated film 104 is provided on the major surface of the semiconductor wafer 101 corresponding to the dicing line 103. It is thus possible to prevent dishing when the surface of the third insulation film 123 is flattened by CMP.

The bit line 121, diffusion layer contact portion 122, bit line contact portion 126 and wiring layers 129 and 136 also serve as a crack stopper. Thus, even though a crack occurs at the time of dicing, it can be prevented from reaching the semiconductor chip 102.

Although the laminated film 104 remedies dishing on the dicing line 103, stress is easy to concentrate on the insulation film on the dicing line 103 at the time of dicing, thus causing a problem in which a crack 138 easily occurs in the insulation film formed on the dicing line 103. The occurrence of the crack on the dicing line 103 is not so serious. If, however, the insulation film on the dicing line 103 is chipped and dropped due to the crack 138 caused on the insulation film, the chipped film becomes a crack waste and then a pollution source in the subsequent process. If, in particular, the crack waste is large and moves onto the semiconductor chip 102, its influence becomes more serious.

If all the insulation film on the dicing line 103 is eliminated before dicing, the crack 138 can be prevented from occurring. In this case, however, the dicing line 103 cannot be formed concurrently with formation of the opening portion 135, thus complicating the manufacturing process.

BRIEF SUMMARY OF THE INVENTION

As described above, conventionally, dishing can be remedied on a dicing line by providing a laminated film. If, however, a laminated layer is formed, a crack is easily caused on an insulation film on the dicing line by the dicing. If, therefore, an insulation film is greatly chipped and dropped, it will have a great influence upon a semiconductor chip in the subsequent process.

It is accordingly an object of the present invention is to provide a semiconductor device capable of preventing a great waste from being caused by a crack at the time of dicing and thus avoiding an influence of the waste upon a semiconductor chip.

To attain the object, according to a first aspect of the present invention, there is provided a semiconductor device comprising a dicing region provided on a semiconductor substrate, for separating a plurality of semiconductor chips each having a gate portion from the semiconductor substrate, and a projected dummy pattern provided in the dicing region, for preventing a large waste from being caused by a crack during a dicing operation.

According to a second aspect of the present invention, there is provided a method for manufacturing a semiconductor device comprising a step of forming a plurality of semiconductor chips each having a gate portion on a semiconductor substrate and a step of forming a projected dummy pattern in a dicing region between the semiconductor chips in order to prevent a large waste from being caused by a crack during a dicing operation for separating the semiconductor chips from the semiconductor substrate.

According to a third aspect of the present invention, there is provided a method for manufacturing a semiconductor device comprising a step of forming an element isolation region on a semiconductor substrate to provide an element region and a dicing region, a step of laminating a polysilicon film and a WSi film on the semiconductor substrate with a gate oxide film interposed therebetween, a step of patterning the polysilicon film and the WSi film, and a step of forming a SiN film on the WSi film, forming a gate portion of a semiconductor chip in the element region, and forming a projected dummy pattern in the dicing region in order to prevent a large waste from being generated due to a crack in a dicing operation.

According to a fourth aspect of the present invention, there is provided a method for manufacturing a semiconductor device comprising a step of forming an element isolation region on a semiconductor substrate to provide an element region and a dicing region, a step of forming a protection film on the semiconductor substrate, and a step of patterning the protection film to form a projected dummy pattern in the dicing region in order to prevent a large waste from being generated due to a crack in a dicing operation.

According to a fifth aspect of the present invention, there is provided a method for manufacturing a semiconductor device comprising a step of forming an element isolation region on a semiconductor substrate to provide an element region and a dicing region, a step of laminating a polysilicon film and a WSi film on the semiconductor substrate with a gate oxide film interposed therebetween, a step of patterning the polysilicon film and the WSi film, a step of forming a SiN film on the WSi film, forming a gate portion of a semiconductor chip in the element region, and forming a first dummy pattern in the dicing region, a step of forming a protection film on the semiconductor substrate, and a step of patterning the protection film to form a second dummy pattern in the dicing region.

In a semiconductor device so constituted and a method for manufacturing the same, stress can be prevented from concentrating upon an insulation film on a dicing line at the time of dicing. The insulation can thus be prevented from being cracked greatly and a large waste causing a malfunction can be prevented from being generated.

In particular, when a dummy pattern is formed of a protection film, the scattering of waste due to a crack can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

(First Embodiment)

Figure 2A:
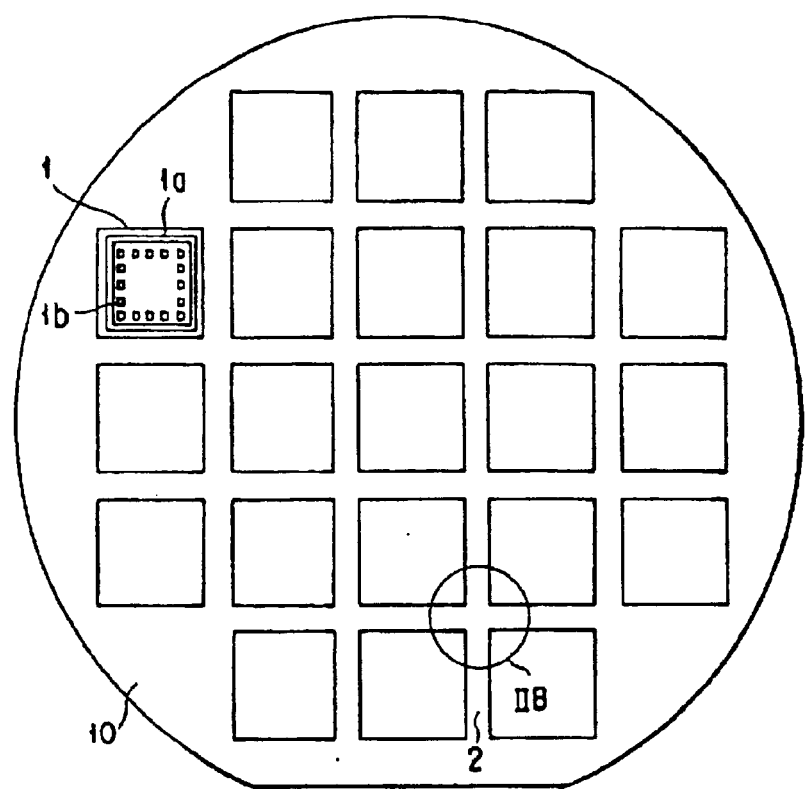
FIG. 2A is a schematic plan view of the configuration of a semiconductor wafer according to a first embodiment of the present invention.
Figure 2B:
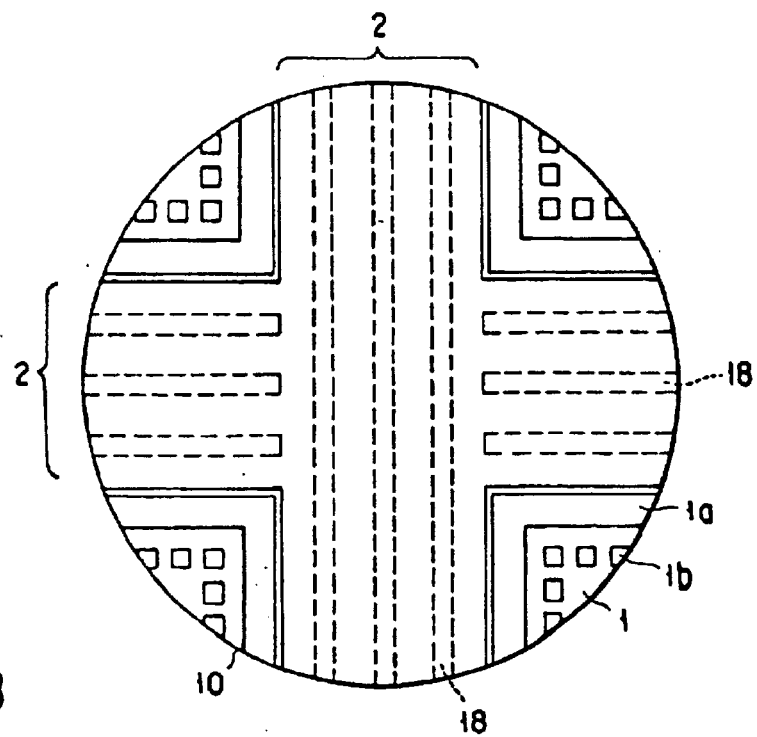
FIG. 2B is an enlarged view of the semiconductor wafer of FIG. 2A.

FIGS. 2A and 2B illustrate the configuration of a semiconductor wafer according to a first embodiment of the present invention. FIG. 2A is a schematic plan view of the semiconductor wafer, while FIG. 2B is an enlarged view of part of the wafer. In the first embodiment, a dummy pattern is applied to a dicing line of a semiconductor memory.

As illustrated in FIG. 2A, a plurality of semiconductor chips 1, which serve as a semiconductor memory device, are formed on a semiconductor wafer (semiconductor substrate) 10. A crack stopper 1a is provided on the top surface of each of the semiconductor chips 1 and along the circumference of thereof. A plurality of electrode pads 1b are arranged substantially at regular intervals inside the crack stopper 1a.

A dicing line (recess portion) 2 is interposed between adjacent semiconductor chips 1 and provided with a plurality of dummy patterns 18 along the direction of dicing as shown in FIG. 2B.

According to the configuration of the wafer, the semiconductor wafer 10 is diced along the dicing lines 2 and divided into semiconductor chips (pellets) 1, resulting in a plurality of semiconductor memory device at the same time.

Figure 1:
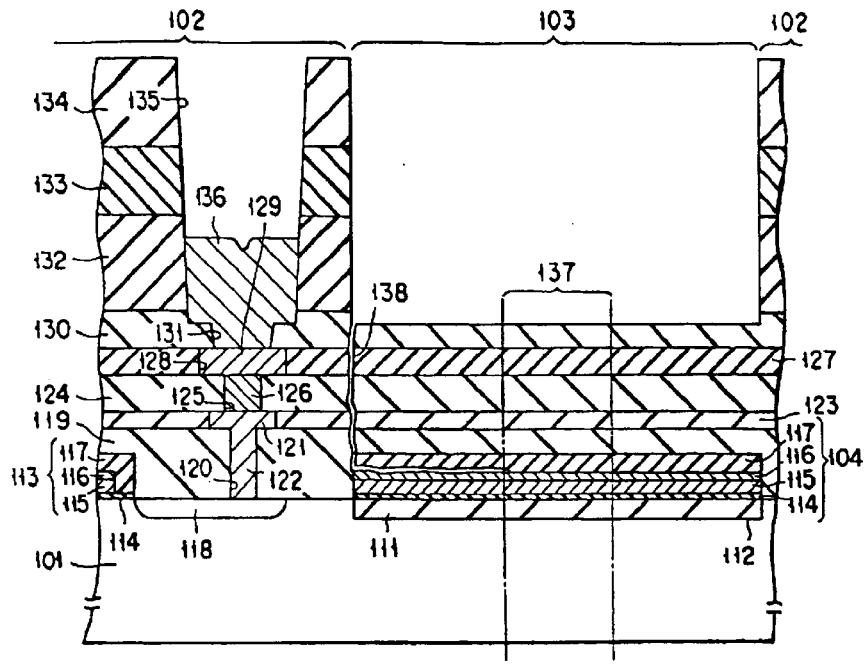
FIG. 1 is a schematic cross-sectional view showing a prior art semiconductor memory in order to explain a countermeasure against dishing on a dicing line.
Figure 3:
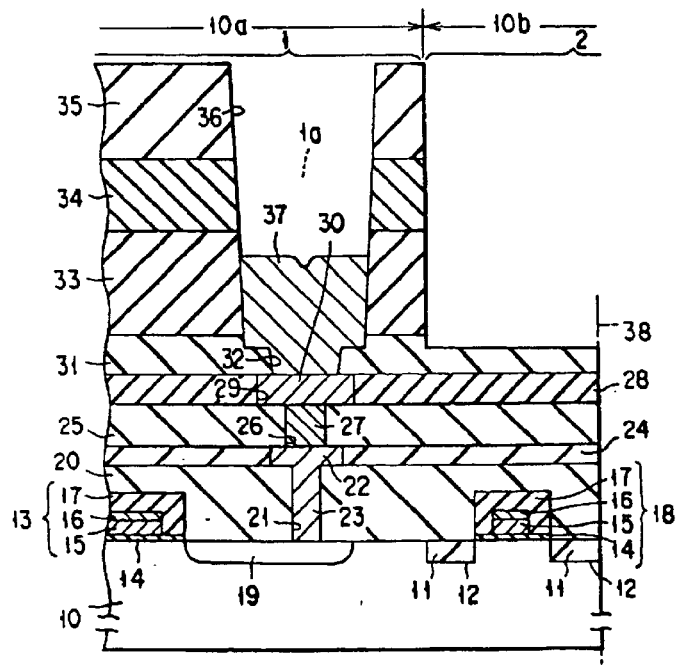
FIG. 3 is a cross-sectional view schematically showing the main part of a semiconductor memory of the present invention.

FIG. 3 illustrates the structure of the foregoing semiconductor memory device. In this semiconductor memory device, part of the dicing line 2 remains on the circumference of the chip 1.

More specifically, a first insulation film (e.g., $SiO_2$ film) 11 is selectively buried in the major surface portion of the semiconductor wafer 10 to form an element isolation region 12 having an STI (Shallow Trench Isolation) structure (the width of which is 1.5 μm or less).

A gate electrode portion 13 of a selective transistor, which serves as a word line of the semiconductor memory, is formed on the major surface of the wafer 10. The gate electrode portion 13 has a laminated structure in which a polysilicon film 15 is formed on a gate oxide film 14, a Wsi film 16 is formed on the film 15, and their peripheral portions are covered with a SiN film 17 serving as a cap material.

On the other hand, at least one dummy pattern 18 is formed on the major surface of the wafer 10 within a dicing region 10b remaining around the chip 1 and serving as the dicing line 2. The dummy pattern 18 is provided between the element isolation regions 12 substantially in a projected fashion and has almost the same wiring structure as that of the gate electrode portion 13.

A diffusion layer 19 serving as a source or a drain is formed on that major surface portion in the element region 10a of the semiconductor wafer 10 which is adjacent to the gate electrode portion 13.

A second insulation film (e.g., $SiO_2$ film) 20 is formed on the major surface of the semiconductor wafer 10. A diffusion layer contact portion 23 communicating with the diffusion layer 19, is provided on the second insulation film 20.

A third insulation film (e.g., $SiO_2$ film) 24 is formed on the second insulation film 20. A bit line 22 connecting to the diffusion layer contact portion 23 is formed on the third insulation film 24.

A fourth insulation film (e.g., $SiO_2$ film) 25 is formed on the third insulation film 24. A bit line contact portion 27 communicating with the bit line 22 is provided on the fourth insulation film 25.

A fifth insulation film (e.g., $SiO_2$ film) 28 is formed on the fourth insulation film 25. A wiring layer (first metal layer) 30 connecting to the bit line contact portion 27 and serving as a fuse layer, is provided on the fifth insulation film 28.

A sixth insulation film (e.g., $SiO_2$ film) 31 is formed on the fifth insulation film 28. An opening portion 32 is formed in the sixth insulation film 31 so as to reach the wiring layer 30.

A seventh insulation film (e.g., TEOS film) 33, an eighth insulation film (e.g., SiN film) 34, and a passivation film (e.g., PI film) 35 are formed in order on the sixth insulation film 31.

An opening portion 36 reaching the opening portion 32 is formed in the films 31, 33, 34 and 35 within the element region 10a. A wiring layer (second metal layer) 37 for applying a power supply voltage, which is connected to the wiring layer 30, is provided in the opening portion 32.

In the dicing region 10b, the seventh and eighth insulation films 33 and 34, passivation film 35 and part of the sixth insulation film 31 are removed to form the dicing line 2.

The semiconductor wafer 10 is diced along the dicing line 2 and thus cut from a cut portion 38, resulting in a semiconductor memory device.

A method for manufacturing a semiconductor memory device having the above constitution will now be described with reference to FIGS. 4A to 4U.

Figure 4A:
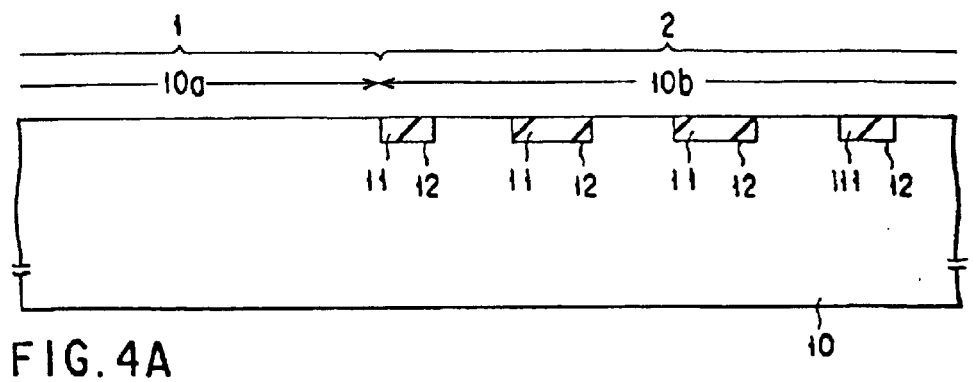
FIGS. 4A to 4U are cross-sectional views showing a semiconductor wafer in order to explain a method for manufacturing a semiconductor memory of the present invention.

First, a first insulation film 11 is selectively buried in the major surface portion of a semiconductor wafer 10 to form an element isolation region 12 having an STI structure with a width of 1.5 μm or less, and the semiconductor wafer 10 is divided into an element region 10a for forming a semiconductor chip 1 and a dicing region 10b serving as a dicing line 2 (see FIG. 4A). Though not shown, the element isolation region 12 is formed in the element region 10a as well as in the element region 10b and used for element isolation.

Figure 4B:
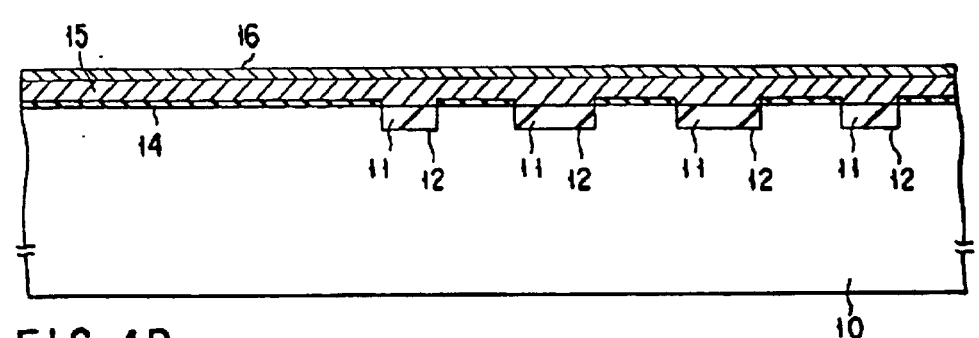

Then a gate electrode portion 13 of a selective transistor, which serves as a word line of the semiconductor memory, is formed on the major surface of the semiconductor wafer 10 within the element region 10a. At the same time, in the dicing region 10b, a plurality of dummy patterns each having substantially the same wiring structure as that of the gate electrode portion 13 and a width of about 1.5 μm, are formed on the major surface of the wafer 10 between adjacent element isolation regions 12. In other words, a gate oxide film 14 is grown on the major surface of the semiconductor wafer 10, a polysilicon film 15 having a thickness of about 1000 Å is formed on the entire surface of the film 14, and a Wsi film 16 having a thickness of about 500 Å is formed on the film 15 (see FIG. 4B).

Figure 4C:
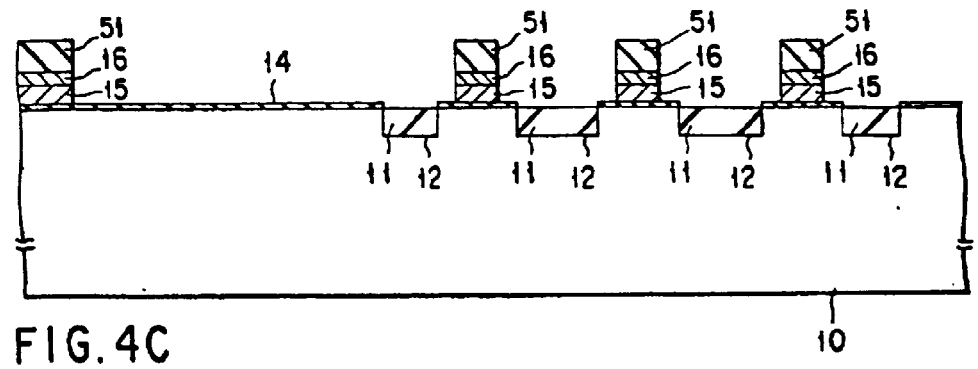
Figure 4D:
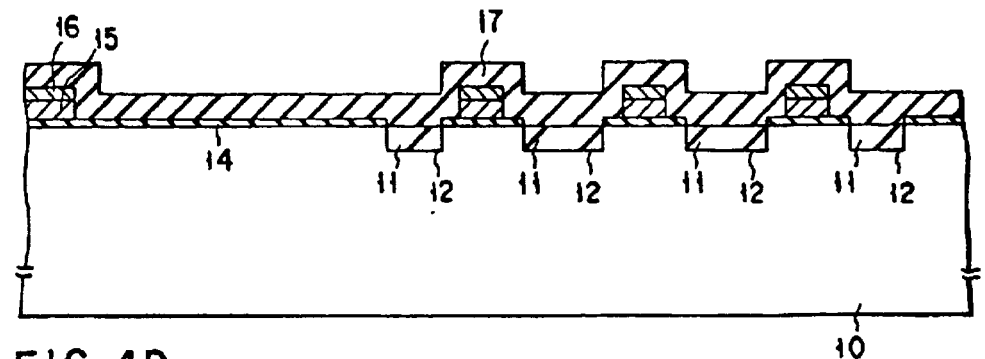
Figure 4E:
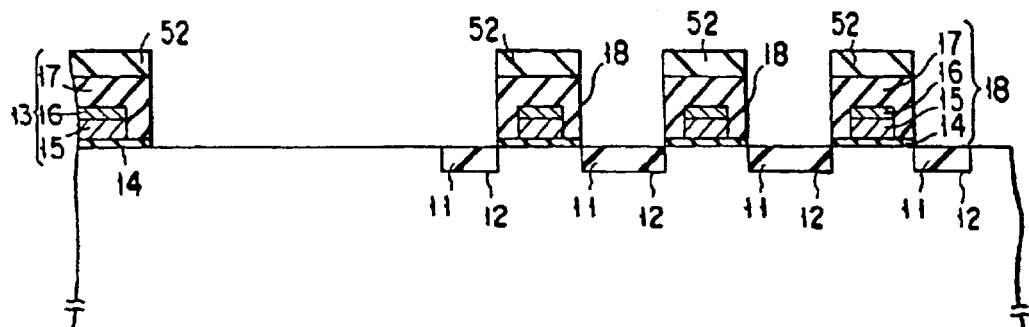

The polysilicon film 15 and Wsi film 16 are patterned using a resist film 51 as a mask (see FIG. 4C). After the film 15 is removed, a SiN film 17 having a thickness of about 2000 Å is formed on the entire surface of the resultant structure (see FIG. 4D). The SiN film 17 is patterned using a resist film 52 as a mask and the gate oxide film 14 projected from the surface of the wafer 10 is eliminated (see FIG. 4E).

Thus, the gate electrode portion 13, which is constituted by laminating the polysilicon film 15 and Wsi film 16 and then covering their peripheral portions with the SiN film 17 serving as a cap material, is formed on the gate oxide film 14 on the major surface of the wafer 10 in the element region 10a and, at the same time, the dummy patterns 18 each having substantially the same wiring structure as that of the gate electrode portion 13 are formed on the major surface of the wafer 10 between the element isolation regions 12 in the dicing region 10b.

The dummy patterns 18 are arranged in parallel with each other along the dicing direction. Using the dummy patterns 18, a TEG (not shown) for test evaluation is formed.

Figure 4F:
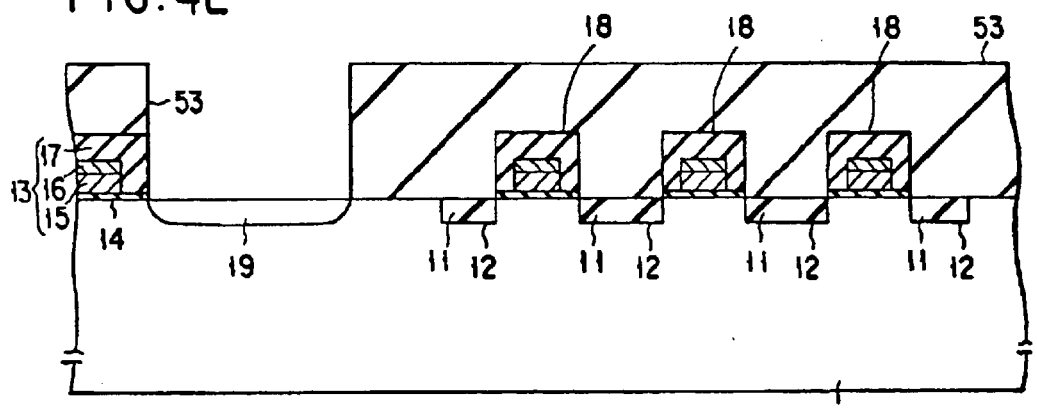

After that, impurities are ion-implanted using a resist film 53 as a mask to form a diffusion layer 19 serving as a source or a drain in that major surface portion of the semiconductor wafer 10 which is adjacent to the gate electrode portion 13 within the element region 10a (see FIG. 4F).

Figure 4G:
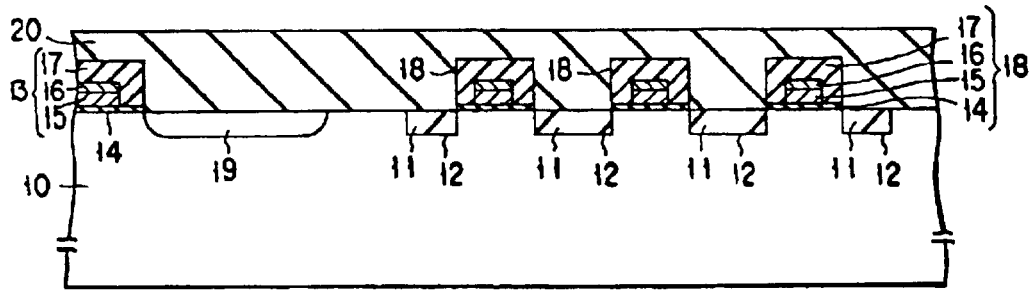

After the resist film 53 is removed, a second insulation film 20 is deposited on the entire surface of the resultant structure and its surface is flattened by CMP (see FIG. 4G). In this case, the second insulation film 20 is so formed that its thickness is about 500 Å on the dummy patterns 18.

Figure 4H:
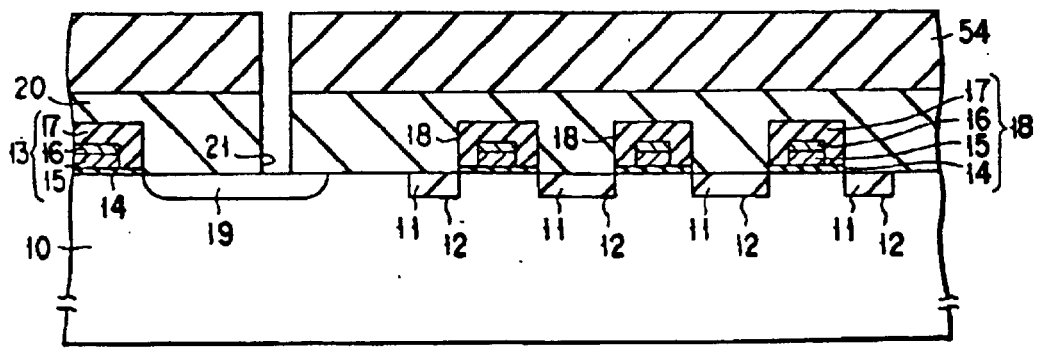

Using a resist film 54 as a mask, an opening portion 21 communicating with the diffusion layer 19 is formed in the second insulation film 20 by RIE (Reactive Ion Etching) (see FIG. 4H).

Figure 4I:
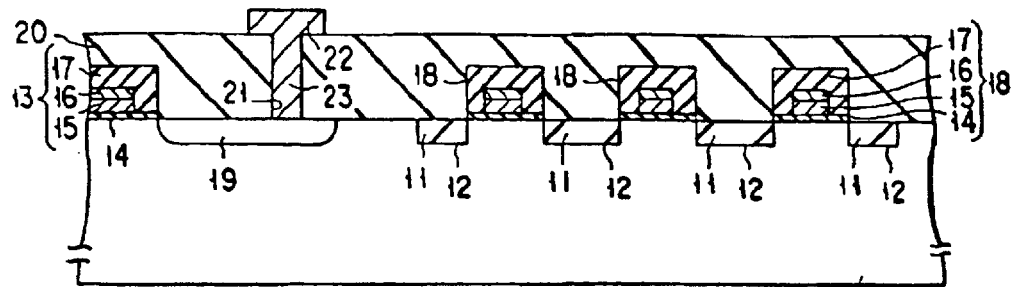

After the resist film 54 is removed, a tungsten (W) film having a thickness of about 2500 Å is evaporated onto the second insulation film 20 so as to fill the opening portion 21. The tungsten film is then patterned to form a bit line 22 and a diffusion layer contact portion 23 integrally as one component (see FIG. 4I).

Figure 4J:
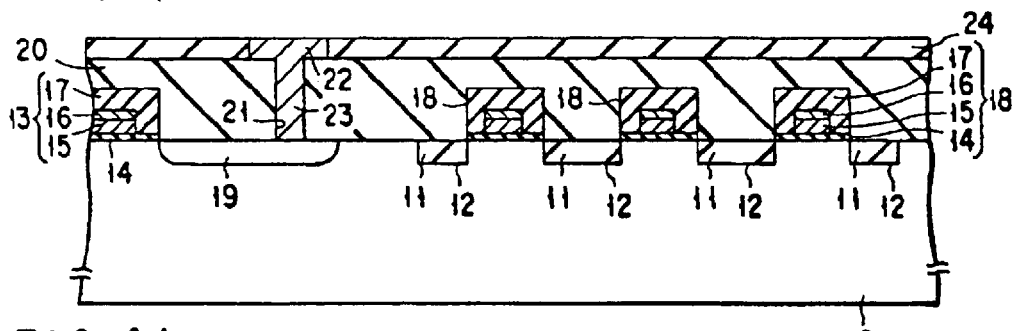

A third insulation film 24 is formed on the whole surface of the resultant structure and its surface is flattened by CMP using the top surface of the bit line 22 as a stopper (see FIG. 4J).

Figure 4K:
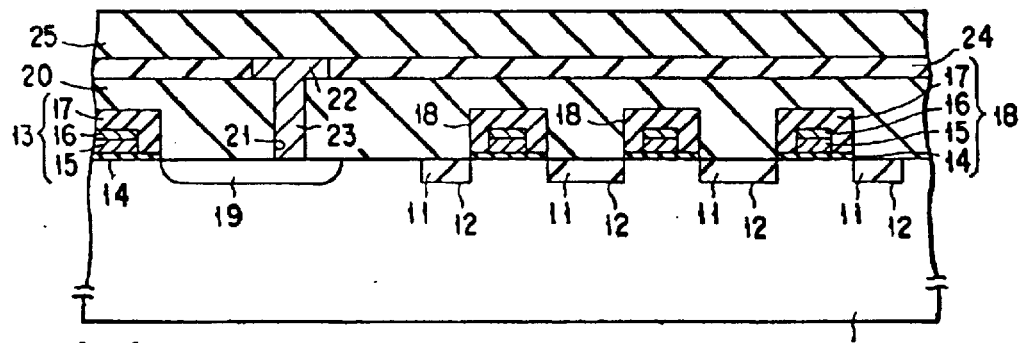

A fourth insulation film 25 is formed on the entire surface of the resultant structure and its surface is flattened by CMP (see FIG. 4K). In this case, it is formed such that its thickness is set to about 5000 Å.

Figure 4L:
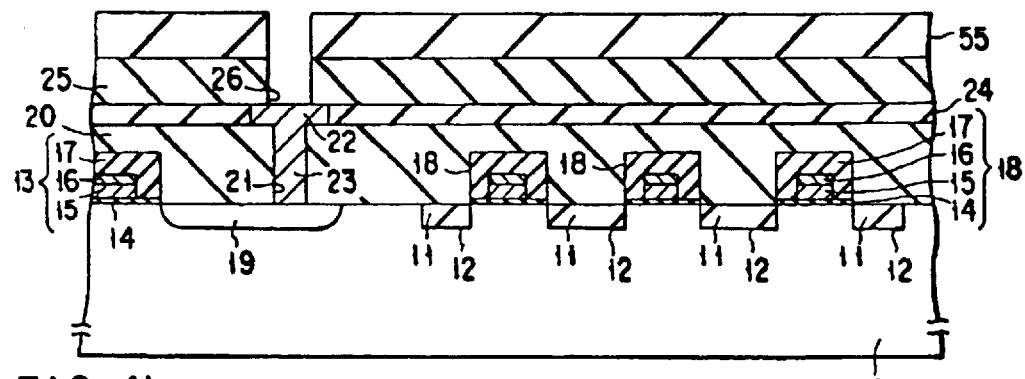
Figure 4M:
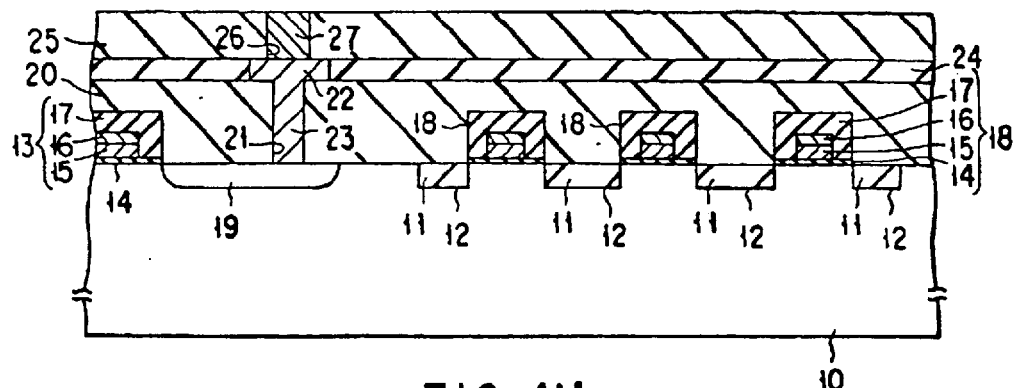

Thereafter, an opening portion 26 communicating with the bit line 22 is formed in the fourth insulation film 25 by RIE using a resist film 55 as a mask (see FIG. 4L). The opening portion 26 is filled with the tungsten film to form a bit line contact portion 27 communicating with the bit line 22 (see FIG. 4M).

Figure 4N:
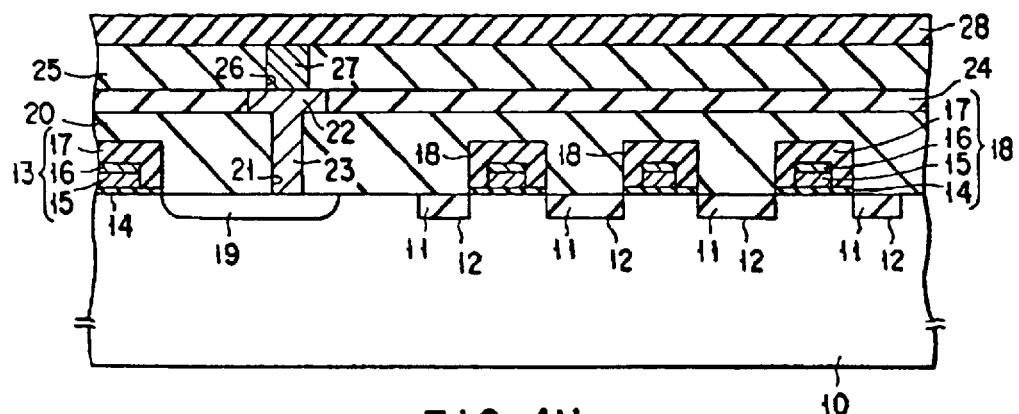
Figure 4O:
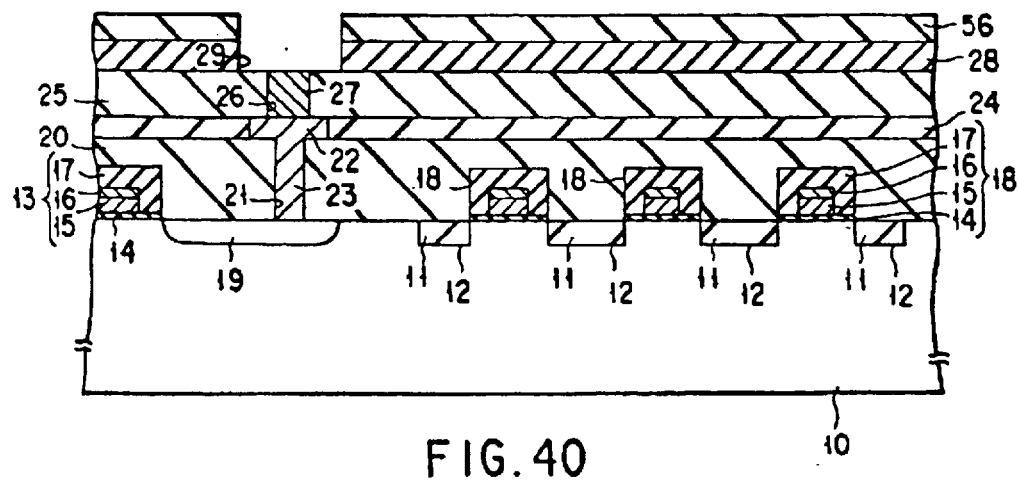
Figure 4P:
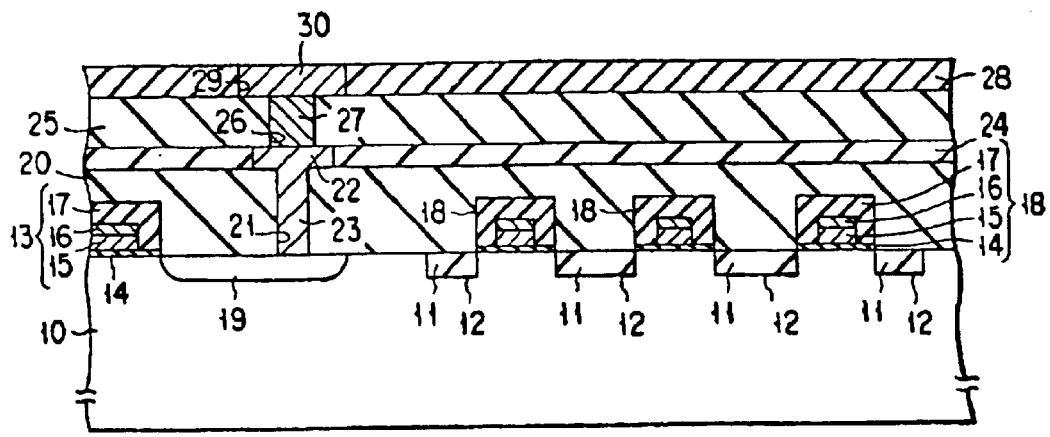

After that, a fifth insulation film 28 is deposited on the entire surface of the resultant structure and its surface is flattened by CMP so as to have a thickness of about 3000 Å on the bit line contact portion 27 (see FIG. 4N). Using a resist film 56 as a mask, a wiring groove 29 communicating with the bit line contact portion 27 is formed in the fifth insulation film 28 by RIE (see FIG. 4O). The wiring groove 29 is filled with an Al/Cu film to form a wiring layer serving as a fuse layer (see FIG. 4P).

Figure 4Q:
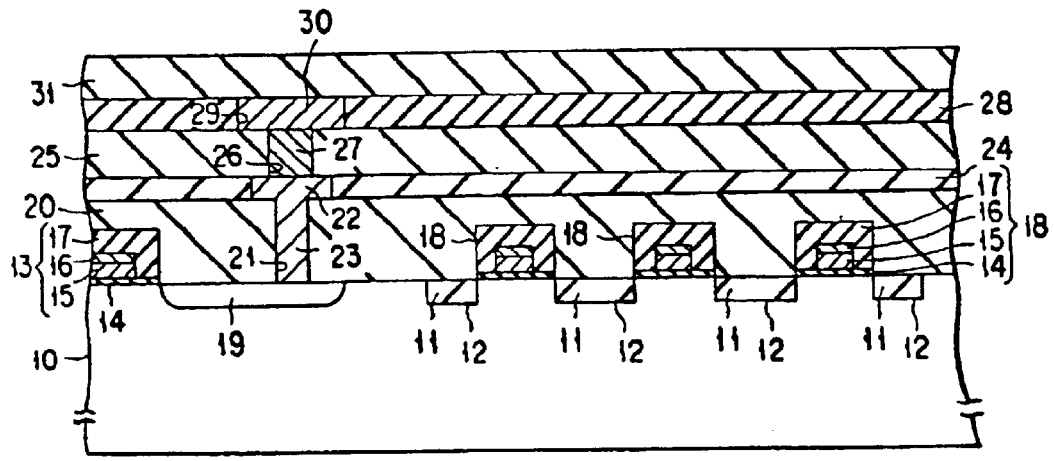
Figure 4R:
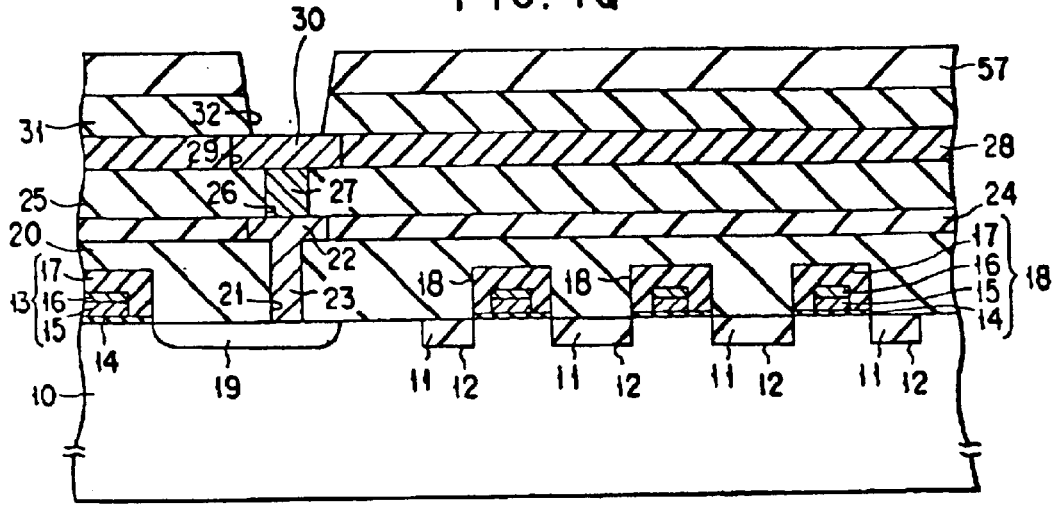

After a sixth insulation film 31 having a thickness of 3000 Å or more is deposited and its surface is flattened by CMP (see FIG. 4Q). Then, using a resist film 57 as a mask, an opening portion 32 communicating with the wiring layer is formed in the sixth insulation film 31 by RIE (see FIG. 4R).

Figure 4S:
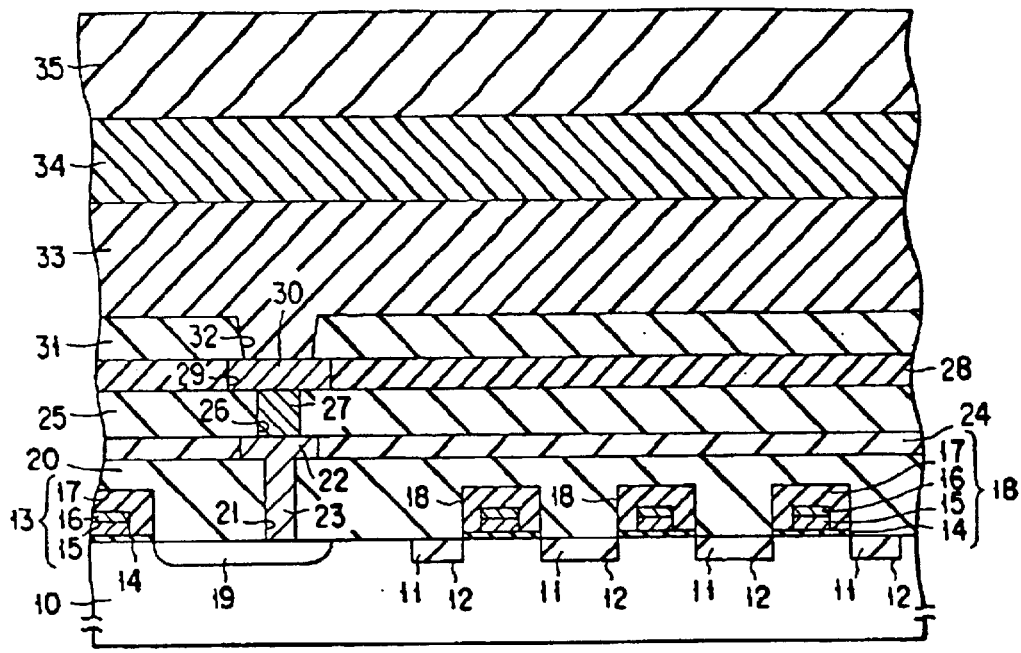
Figure 4T:
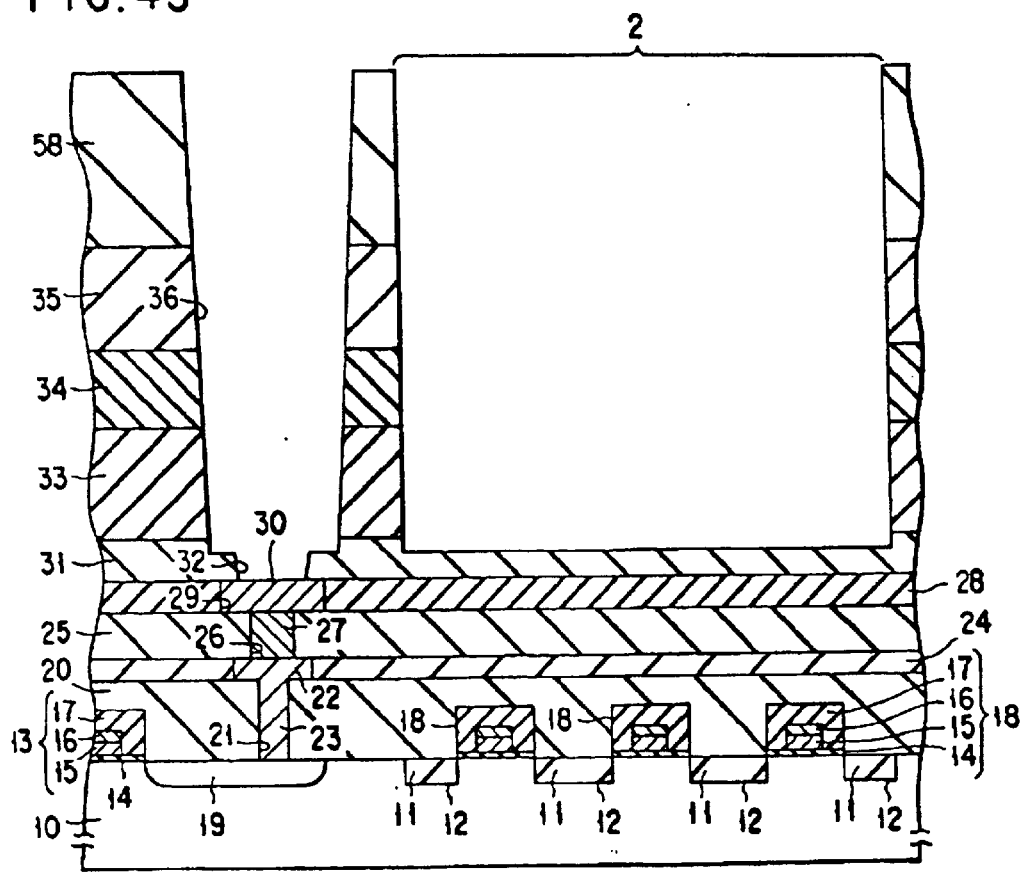
Figure 4U:
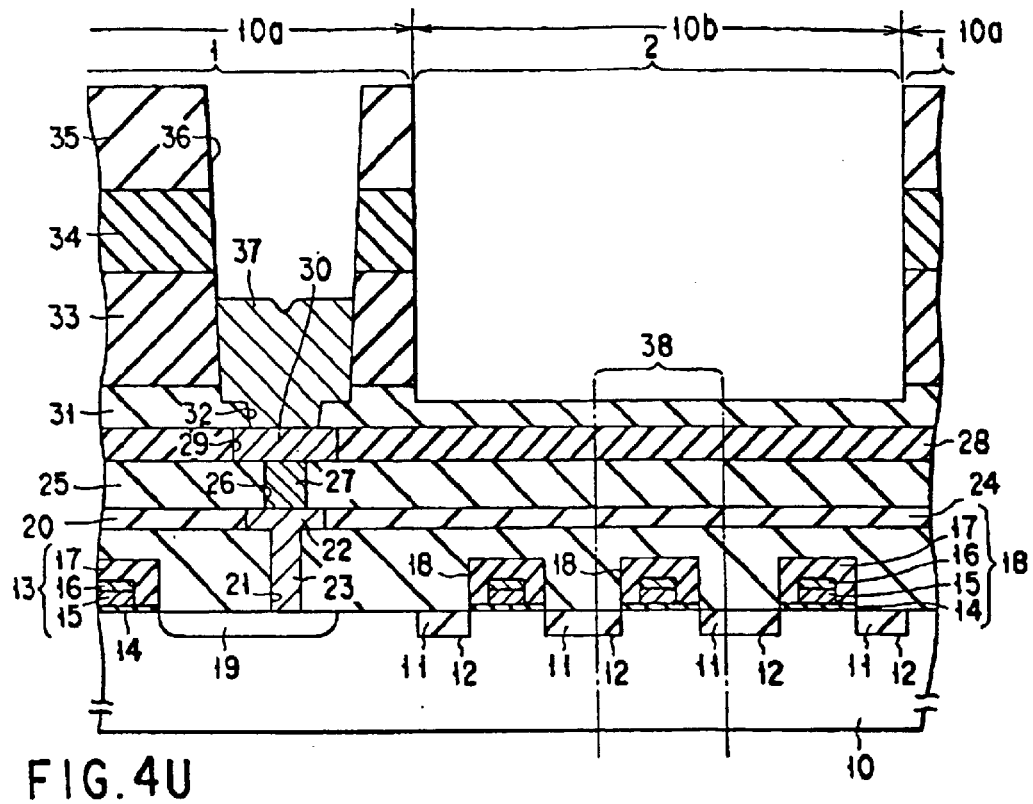

After the resist film 57 is removed, a seventh insulation film 33, an eighth insulation film 34 and a passivation film 35 are deposited in order on the entire surface of the resultant structure (see FIG. 4S). Using a resist film 58 as a mask, an opening portion 36 communicating with the opening portion 32 is formed by RIE in the passivation film 35, eighth insulation film 34, seventh insulation film 33 and sixth insulation film 31 (see FIG. 4T).

At the same time, the passivation film 35, eighth insulation film 34, seventh insulation film 33 and part of the sixth insulation film 31 are removed from above the dummy patterns to form a dicing line 2 having a width of 150 μm. In this case, the sixth insulation film 31 is removed by etching, leaving a thickness of at least 3000 Å such that the total thickness of the insulation films 20, 24, 25, 28 and 31 is set to about 18500 Å on the dummy patterns 18. Then, the opening portion 32 and part of the opening portion 36 are filled with an Al/Cu film to form a wiring layer 37 for applying a power supply voltage, resulting in a plurality of semiconductor chips (see FIG. 4U).

After that, the semiconductor wafer 10 is diced along the dicing line 2 and thus cut from a cut portion 38 (having a width of 40 μm, for example), thereby separating the semiconductor chips 1 from each other and completing a plurality of semiconductor memory device at the same time.

Since the projected dummy pattern 18 is formed on the dicing line 2, stress can be prevented from concentrating upon the insulation film formed on the dicing line when the wafer is diced. Even though a track occurs, the insulation film can be prevented from being chipped greatly. Consequently, even when a crack waste, which will become a pollution source in the subsequent step, is generated, the influence thereof upon the semiconductor chips 1 can be reduced.

As described above, the stress caused when a semiconductor wafer is diced can be dispersed on the insulation film on the dicing line, in other words, a plurality of dummy patterns are provided on the dicing line in order to prevent a large waste from being generated due to a crack of the insulation film. The insulation film can thus be prevented from being cracked greatly. Even though a crack occurs, a crack waste can be minimized. Therefore, the defectives due to the large waste can be decreased and the influence of the crack waste upon the semiconductor chips can be minimized, resulting in greatly improving in yield and reliability of semiconductor products.

Since, furthermore, the crack waste can be minimized, the range within which the crack occurs can be narrowed, making it possible to decrease the width (150 μm) of the existing dicing line in about half (80 μm or less). Since, therefore, the semiconductor chips can be arranged closer to each other on the semiconductor wafer, the number of chips per wafer can be increased and the manufacturing costs can be lowered.

The dummy patterns create the same effect as that of the prior art case with respect to not only the minimization of crack wastes but also the dishing on the dicing lines. In other words, the dishing can be prevented when at least the surface of the third insulation film is flattened by CMP.

In particular, the distance between the dummy patterns, i.e., the width of the element isolation region has only to be 1.5 μm or less. If this condition is satisfied, the dishing can be prevented and the object of the present invention can adequately be attained whatever width the dummy pattern has (preferably about 1.5 μm).

Since, moreover, the range within which a crack occurs can be narrowed, the crack stopper (which is constituted of bit line 22, diffusion layer contact portion 23, bit line contact portion 27, and wiring layers 30 and 37) 1a can be deleted, with the result that the semiconductor chips can easily be miniaturized.

In the foregoing first embodiment of the present invention, at least one of a plurality of dummy patterns is formed on the dicing line remaining on the circumference of the semiconductor chip 1. The present invention is not limited to this, but some of the dummy patterns can be formed thereon.

(Second Embodiment)

Figure 5:
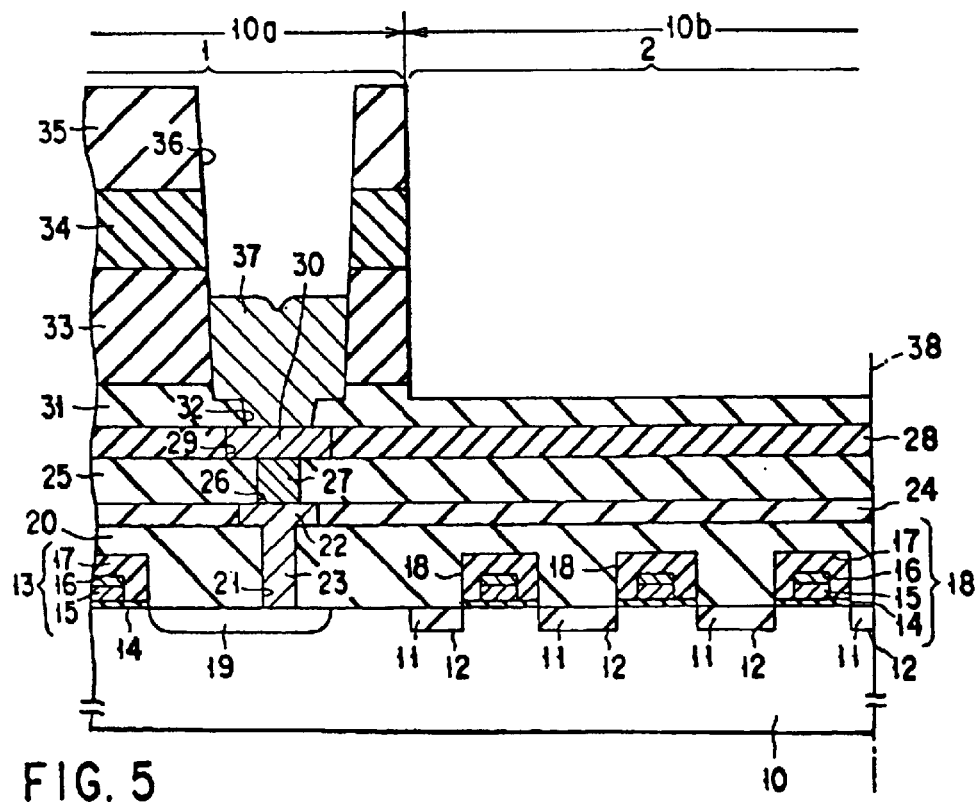
FIG. 5 is a schematic cross-sectional view showing the main part of a semiconductor memory according to a second embodiment of the present invention.

FIG. 5 schematically shows the constitution of a semiconductor memory according to a second embodiment of the present invention.

In the second embodiment, a plurality of dummy patterns 18 are formed on part of a dicing region 10b remaining on the circumference of a semiconductor chip 1. This constitution can easily be achieved by adjusting the widths of a dicing line 2, a cut portion 38, a dummy pattern 18, and an element isolation region 12.

Since, in this constitution, too, the dummy patterns 18 prevent stress from being concentrated on an insulation film when a wafer is diced, substantially the same advantage as that of the first embodiment can be expected.

The present invention is not limited to a plurality of dummy patterns. For example, even when a single dummy pattern is formed, substantially the same advantage as that of the first embodiment can be expected.

(Third Embodiment)

Figure 6:
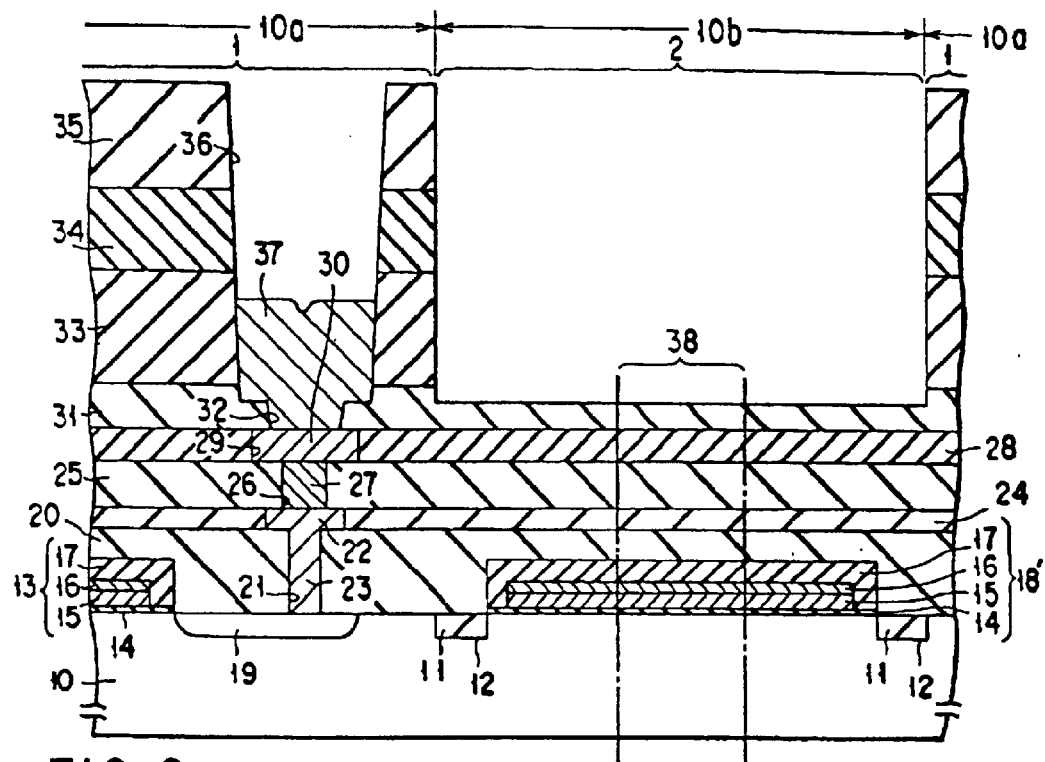
FIG. 6 is a schematic cross-sectional view of the main part of a semiconductor wafer according to a third embodiment of the present invention.

FIG. 6 is a schematic cross-sectional view of a semiconductor wafer according to a third embodiment of the present invention in which a single dummy pattern is formed on a dicing line.

In the third embodiment, an almost projected single dummy pattern 18' having substantially the same wiring structure as that of a gate electrode portion of a selective transistor, is formed in parallel with the dicing direction between element isolation regions 12 having an STI structure each provided at an end portion of the major surface of a semiconductor wafer 10 within a dicing region 10b.

In this constitution, too, the stress applied when the wafer is diced can be dispersed on the insulation film. Substantially the same advantage as that of the foregoing first embodiment can thus be expected.

The present invention is not limited to a dummy pattern having substantially the same wiring structure as that of the gate electrode portion of the selective transistor. For example, the object of the present invention can sufficiently be attained even when the insulation film on the dicing line is used as a dummy pattern.

(Fourth Embodiment)

Figure 7:
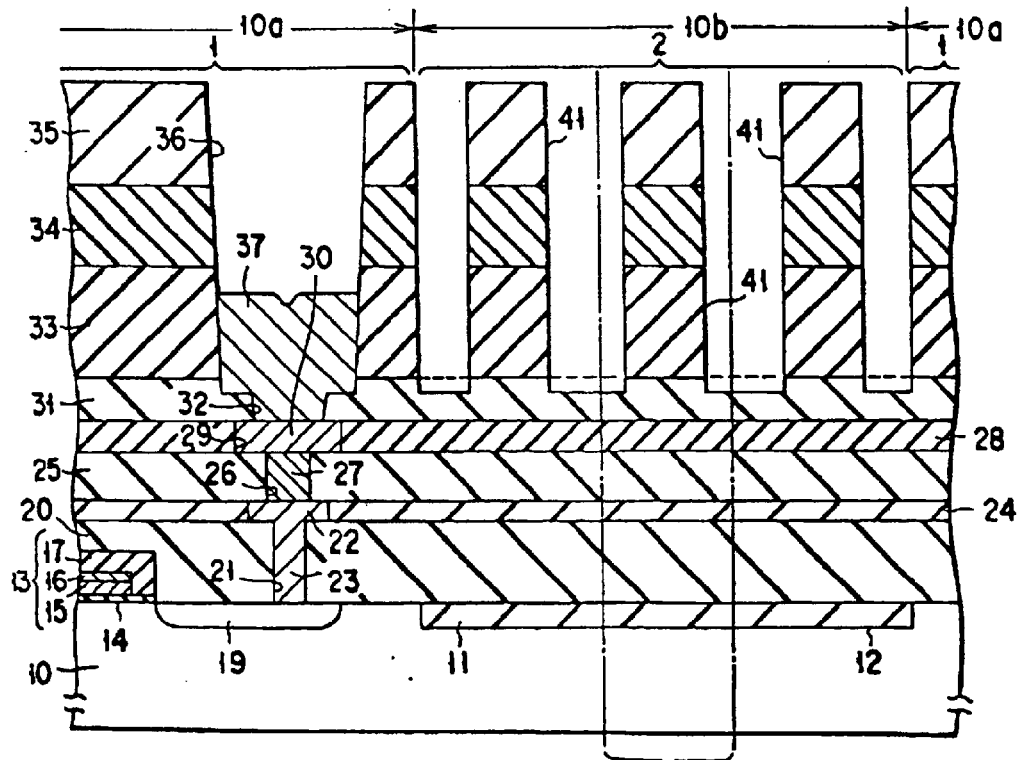
FIG. 7 is a schematic cross-sectional view of the main part of a semiconductor wafer according to a fourth embodiment of the present invention.

FIG. 7 is a schematic cross-sectional view of a semiconductor wafer according to a fourth embodiment of the present invention. In this wafer, a plurality of dummy patterns 41 including at least a passivation film (protection film) 35 are formed by patterning an eighth insulation film 34, a seventh insulation film 33 and part of a sixth insulation film 31 in a projected fashion in parallel with the dicing direction.

In the fourth embodiment, any distance between dummy patterns 41 and any width of each of the dummy patterns can be employed if the stress applied when the wafer is diced can be dispersed on the insulation films.

In particular, in the fourth embodiment, not only a crack waste can be minimized, but also a thick passivation film 35 formed on the insulation film prevents a crack waste from being scattered.

The present invention is not limited to the case where either the dummy patterns 18 (FIGS. 3 and 5) and 18' (FIG. 6) having substantially the same wiring structure as that of the gate electrode portion of the selective transistor or the dummy pattern 41 (FIG. 7) obtained by patterning at least the passivation film 35 is provided.

(Fifth Embodiment)

Figure 8:
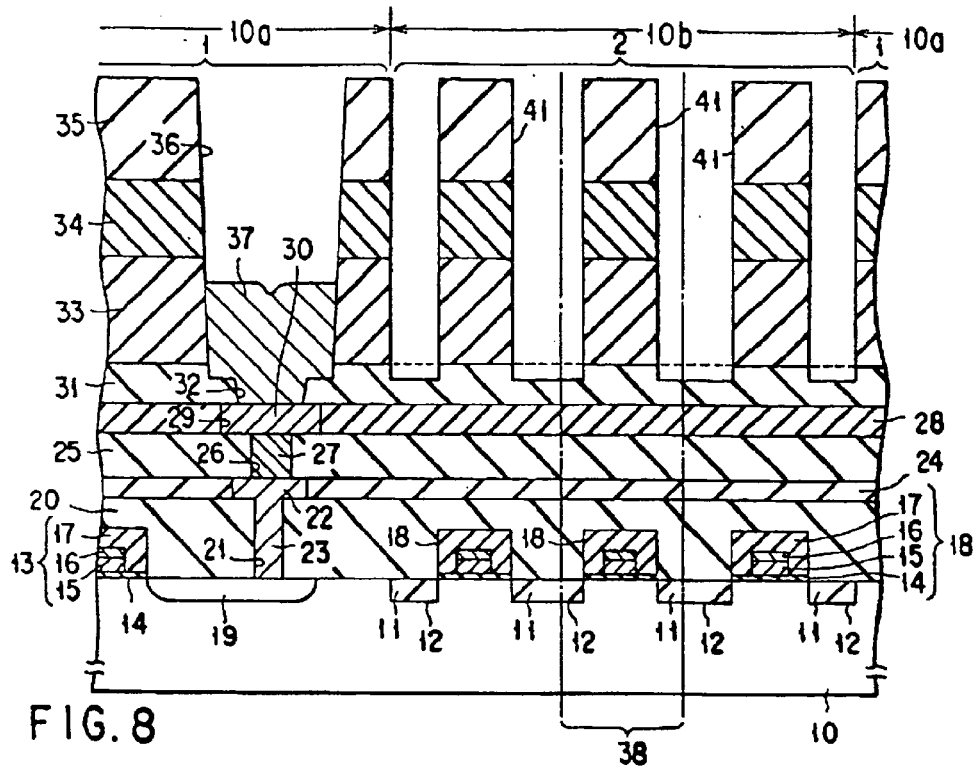
FIG. 8 is a schematic cross-sectional view of the main part of a semiconductor wafer according to a fifth embodiment of the present invention.

FIG. 8 is a schematic cross-sectional view of a semiconductor wafer according to a fifth embodiment of the present invention in which both first dummy patterns 18 and second dummy patterns 41 are formed on a dicing line 2.

In the fifth embodiment, too, the distance between adjacent dummy patterns has only to be set to 1.5 $\mu$m or less. If this condition is satisfied, it does not matter whatever width the dummy patterns 18 and 41 have.

(Sixth Embodiment)

Figure 9:
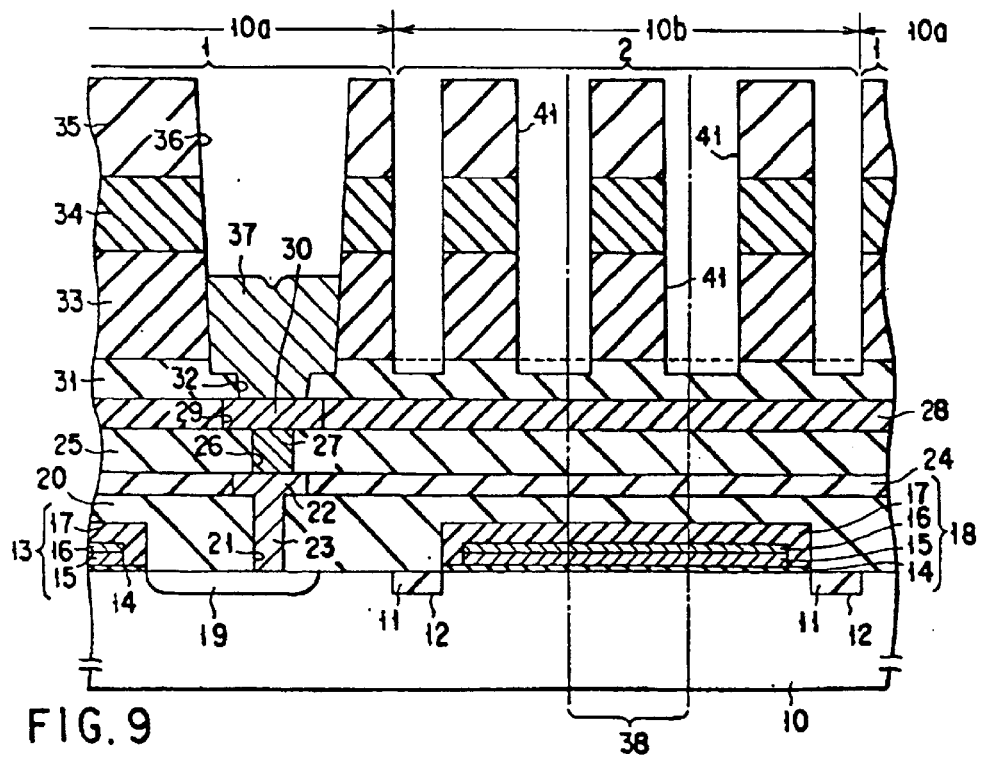
FIG. 9 is a schematic cross-sectional view of the main part of a semiconductor wafer according to a sixth embodiment of the present invention.

FIG. 9 is a schematic cross-sectional view of a semiconductor wafer according to a sixth embodiment of the present invention in which a single dummy pattern (first dummy pattern) 18' and a plurality of dummy patterns (second dummy patterns) 41 are provided on a dicing line 2.

In the sixth embodiment, too, it does not matter whatever width the dummy patterns 41 have.

The structure of the wafer according to the fifth and sixth embodiments prevents dishing and a synergistic effect between the dummy patterns 18 and 18' and dummy patterns 41 produces a greater advantage of preventing a large waste from being generated.

The foregoing first to sixth embodiments are applied to a semiconductor memory. However, they can be applied to a semiconductor device other than a memory, such as a logic having a thick laminated insulation films and, in this case, too, a great advantage can be obtained.

Various changes and modifications can be made without departing from the scope of the subject matter of the present invention.

According to the present invention as described in detail, the concentration of stress upon the insulation film formed on the dicing line at the time of dicing can be avoided by providing a projected dummy pattern on the dicing line. Even if a crack is caused, a chip of the insulation film can be minimized and thus the influence of a crack waste, which serves as a pollution source in the subsequent step, upon the semiconductor chip can be reduced. Consequently, there can be provided a semiconductor device and a method for manufacturing the same which prevents a large waste generated by a crack when the wafer is diced and the influence of the large waste upon the semiconductor chip can be avoided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a dicing region provided on a semiconductor substrate to separate a plurality of semiconductor chips each having a gate portion from each other;
    a plurality of element isolation regions provided on a surface portion of the semiconductor substrate within the dicing region;

a plurality of first dummy patterns formed on a surface of the semiconductor substrate between the plurality of element isolation regions, respectively, the plurality of first dummy patterns being formed independently in a direction intersecting a dicing direction; and a plurality of second dummy patterns formed above the semiconductor substrate within the dicing region so as to correspond to the plurality of first dummy patterns, respectively.

2. The semiconductor device according to claim 1, wherein the dummy pattern has a wiring structure which is substantially equal to that of the gate portion.

3. The semiconductor device according to claim 1, wherein the plurality of first dummy patterns each have a structure which is substantially similar to that of the first gate portion.

4. The semiconductor device according to claim 3, wherein the plurality of first dummy patterns and the gate portions each have a laminated structure including a gate oxide film, a polysilicon film, a WSi film, and a SiN film.

5. The semiconductor device according to claim 1, wherein the plurality of element isolation regions each have an STI structure.

6. The semiconductor device according to claim 1, wherein the plurality of first dummy patterns and the element isolation regions are arranged alternately to form a predetermined repetitive pattern.

7. The semiconductor device according to claim 1, wherein the plurality of second dummy patterns include at least protection films provided on the surface of the semiconductor substrate.

8. The semiconductor device according to claim 7, wherein the plurality of second dummy patterns include insulation films provided on the surface of the semiconductor substrate.

9. The semiconductor device according to claim 1, wherein the dummy pattern is formed along a dicing direction.

10. The semiconductor device according to claim 1, wherein the dummy pattern is formed concurrently with formation of the gate portion.

11. The method according to claim 10, wherein the dummy pattern has a wiring structure which is substantially equal to that of the gate portion.

12. A method of manufacturing a semiconductor device comprising:

forming a plurality of semiconductor chips each having a gate portion on a semiconductor substrate; and forming a plurality of projected dummy patterns in a dicing region between the semiconductor chips in order to prevent a large waste from being caused by a crack during a dicing operation to separate the semiconductor chips from the semiconductor substrate, the plurality of projected dummy patterns being formed independently in a direction intersecting a dicing direction.

* * * * *